United States Patent
Xie et al.

(10) Patent No.: US 11,094,781 B2
(45) Date of Patent: Aug. 17, 2021

(54) NANOSHEET STRUCTURES HAVING VERTICALLY ORIENTED AND HORIZONTALLY STACKED NANOSHEETS

(71) Applicant: International Business Machines Corporation, Armonk, NY (US)

(72) Inventors: Ruilong Xie, Niskayuna, NY (US); Kangguo Cheng, Schenectady, NY (US); Huimei Zhou, Albany, NY (US); Ardasheir Rahman, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/671,609

(22) Filed: Nov. 1, 2019

(65) Prior Publication Data
US 2021/0134949 A1   May 6, 2021

(51) Int. Cl.
*H01L 29/06* (2006.01)
*H01L 29/78* (2006.01)
*H01L 29/66* (2006.01)

(52) U.S. Cl.
CPC ...... *H01L 29/0673* (2013.01); *H01L 29/6681* (2013.01); *H01L 29/785* (2013.01)

(58) Field of Classification Search
CPC .............. H01L 29/0673; H01L 29/785; H01L 29/6681; H01L 29/66666; H01L 29/7827; H01L 27/0886
See application file for complete search history.

(56) References Cited

U.S. PATENT DOCUMENTS

| 7,230,286 | B2 | 6/2007 | Cohen et al. |
| 8,637,849 | B2 | 1/2014 | Deligianni et al. |
| 8,742,492 | B2 | 6/2014 | Chuang et al. |
| 9,397,200 | B2 | 7/2016 | Qi |
| 9,748,382 | B1 | 8/2017 | Gluschenkov et al. |
| 9,899,529 | B2 | 2/2018 | Hong et al. |
| 9,941,118 | B2 | 4/2018 | Leobandung |

(Continued)

OTHER PUBLICATIONS

A. Veloso et al., Vertical Nanowire FET Integration and Device Aspects:, ECS Transactions, 72 (4) 31-42 2016.

*Primary Examiner* — Changhyun Yi
(74) *Attorney, Agent, or Firm* — Fleit Intellectual Property Law; Thomas S. Grzesik

(57) ABSTRACT

A nanosheet semiconductor structure and method for forming the same, where the nanosheet semiconductor structure includes a substrate and a nanosheet stack comprising vertically oriented nanosheets. A gate structure contacts and wraps around the vertically oriented nanosheets. A source layer and a drain layer are each disposed adjacent to the nanosheet stack. An inner spacer is disposed in contact with a bottom surface of the nanosheet stack. The method includes forming an alternating pattern of first spacers and second spacers on a semiconductor stack. The first spacers and one or more underlying portions of the semiconductor stack are removed thereby forming a plurality of trenches each adjacent to one or more of the second spacers. The plurality of trenches defines a plurality of vertically oriented nanosheets. A plurality of sacrificial spacers are formed each in contact with one or more vertically oriented nanosheets of the plurality of vertically oriented nanosheets.

19 Claims, 19 Drawing Sheets

(56) References Cited

U.S. PATENT DOCUMENTS 10,103,237 B2 10/2018 Leobandung
2017/0133513 A1* 5/2017 Hong ................ H01L 29/78684
2017/0170313 A1 6/2017 Chan et al.

* cited by examiner

NANOSHEET STRUCTURES HAVING VERTICALLY ORIENTED AND HORIZONTALLY STACKED NANOSHEETS

BACKGROUND OF THE INVENTION

The present invention generally relates to the field of semiconductors, and more particular relates to gate-all-around transistors.

As semiconductor devices scale to smaller dimensions, gate-all-around devices such as nanosheet devices provide advantages. For example, gate-all-around devices provide area efficiency and increased drive current within a given layout area. One example of a gate-all-around device is a nanosheet field-effect transistor (FET). Nanosheet FETs are becoming increasingly pursed as a viable semiconductor device option, especially for transistors at smaller scales, e.g., at five nanometer technology (nm) and technologies with even smaller scales. A nanosheet FET transistor typically includes a substrate, an isolation layer, a number of vertically stacked nanosheets forming a channel, and a gate. A nanosheet is formed of a thin layer of semiconductor channel material having a vertical thickness that is typically less than a width of the material.

SUMMARY OF THE INVENTION

In one embodiment, a method for forming a nanosheet semiconductor structure comprises forming an alternating pattern of first spacers and second spacers on a semiconductor stack. A top surface of each first spacer and each second spacer are planar with each other. The first spacers and one or more underlying portions of the semiconductor stack are removed thereby forming a plurality of trenches each adjacent to one or more of the second spacers. The plurality of trenches defines a plurality of vertically oriented nanosheets. A plurality of sacrificial spacers are formed each in contact with one or more vertically oriented nanosheets of the plurality of vertically oriented nanosheets.

In another embodiment, a method for forming a nanosheet semiconductor structure comprises forming a mandrel layer on a semiconductor stack. A first alternating pattern of first spacers and second spacers and a second alternating pattern of first spacers and second spacers are formed on opposing sides of the mandrel layer. The first spacers and one or more underlying portions of the semiconductor stack are removed thereby forming a plurality of trenches each adjacent to one or more of the second spacers. The plurality of trenches defines a plurality of vertically oriented nanosheets. A plurality of sacrificial spacers is formed each in contact with one or more vertically oriented nanosheets of the plurality of vertically oriented nanosheets.

In a further embodiment, a nanosheet semiconductor structure comprises a substrate and a nanosheet stack comprising vertically oriented nanosheets. A gate structure contacts and wraps around the vertically oriented nanosheets. A source layer and a drain layer are each disposed adjacent to the nanosheet stack. An inner spacer contacts a bottom surface of the nanosheet stack.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the embodiments of the invention, in which.

DETAIL DESCRIPTION

Figure 1:
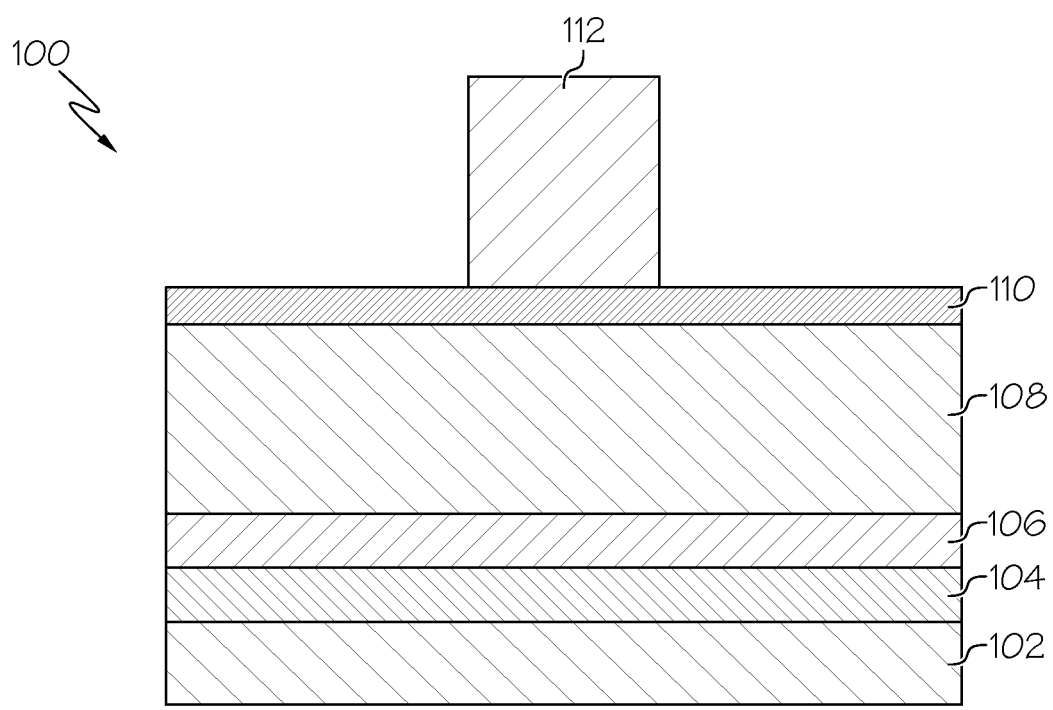
FIG. 1 is a cross-sectional view of a semiconductor structure after a mandrel layer has been patterned on a semiconductor stack according one embodiment of the present invention.

It is to be understood that the present invention will be described in terms of a given illustrative architecture; however, other architectures, structures, substrate materials, process features, and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. In addition, "vertical dimension", "vertical direction", "horizontal dimension", and "horizontal direction" are to be taken with respect to the substrate surface as oriented in the illustrated figures unless otherwise noted.

The present invention may include a design for an integrated circuit chip, which may be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), field-effect transistor (FET), fin field-effect transistor (finFET), metal-oxide-semiconductor field-effect transistor (MOSFET), and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

Deposition may be any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal may be any process that removes material from the wafer; examples include etch processes (either wet or dry) and chemical-mechanical planarization (CMP).

Patterning refers to the shaping or altering of deposited materials and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed by plasma ashing.

Modification of electrical properties has historically entailed doping transistor sources and drains (originally by diffusion furnaces and later by ion implantation). These doping processes are followed by furnace annealing or, in advanced devices, by rapid thermal annealing (RTA); annealing serves to activate the implanted dopants. Modification of electrical properties now also extends to the reduction of a material's dielectric constant in low-k insulators trench exposure to ultraviolet light in UV processing (UVP). Modification is frequently achieved by oxidation, which can be carried out to create semiconductor-insulator junctions, such as in the local oxidation of silicon (LOCOS) to fabricate metal oxide field effect transistors.

Various embodiments will now be discussed in further detail with regard to semiconductor devices and methods of manufacturing the same and, in particular, to a fabrication method and structure of a gate-all-around transistors comprising vertically oriented nanosheets having a vertical thickness that is greater than a width of the nanosheet material. Gate-all-around (GAA) structure field effect transistors (FETs) such as nanosheet devices are a viable device option as CMOS technology continues to scale. Gate-all-around structure FETs can provide improved electrostatic control when compared to conventional transistor structures for satisfying requirements of aggressive device scaling.

However, fabrication of gate-all-around FETs presents various challenges. Patterning between conventional horizontally oriented nanosheets is problematic since current patterning materials (e.g., organic planarization layer materials) usually cannot be etched using conventional directional etching processes. Therefore, lateral etching is generally used to remove the patterning material, which results in large undercut areas in opposing areas. For example, due to the small spacing between conventional nanosheets a longer wet etch is generally required to fully remove P-type work function metal from the N-type area. The longer wet etch causes undercutting of the OPL in the P-type area resulting in P-type work function metal being removed from the P-type area. Overcoming this problem becomes even more challenging when the N-to-P spacer is reduced and the width of the nanosheets increases.

Embodiments of the present invention overcome these and other problems by fabricating vertically oriented nanosheets. The vertically oriented nanosheets of one or more embodiments are advantageous over conventional nanosheets since their vertically adjacent orientation requires a much lower wet etch budget to remove exposed work function metals than conventional horizontally oriented nanosheets. Therefore, the non-targeted work function metal is prevented from being undesirably removed.

Referring now to the drawings in which like numerals represent the same or similar elements, FIGS. 1-8, 9A, 10A, 11A, 12A, and 13A are cross-sectional views taken along a line (similar to line 9A of FIG. 9) that passes through a portion of the illustrated structure corresponding to a short axis of a plurality of vertically oriented nanosheets. FIGS. 9B, 10B, 11B, 12B, and 13B are cross-sectional views taken along a line (similar to line 9B of FIG. 9) that passes through a portion of the illustrated structure corresponding to a long axis of a given vertically oriented nanosheet. FIGS. 9C, 10C, and 11C are cross-sectional views taken along a line (similar to line 9C of FIG. 9) corresponding to the short axis of a plurality of vertically oriented nanosheets in a source/drain region of the structure. FIG. 9 is a top view of the illustrated structure. FIGS. 9D and 10D are cross-sectional views taken along a line (similar to line 9D of FIG. 9) corresponding to the short axis of a plurality of vertically oriented nanosheets in a gate spacer region of the structure.

FIG. 1 shows a semiconductor structure 100 comprising a substrate 102; a plurality of sacrificial semiconductor material layers 104, 106; a channel layer 108; an etch stop layer 110; and one or more mandrel layers 112. The substrate 102 may be a bulk substrate comprising silicon (Si). However, the substrate 102 may include materials other than or in addition to silicon. For example, the substrate 102 may include a semiconductor material including, but not necessarily limited to, silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. As used herein, a "semiconductor material" refers to a material having a conductivity in a range from, for example, $3.0\times10^{-4}$ Ohm-cm to $3.0\times10^{3}$ Ohm-cm, and includes an intrinsic semiconductor material, a p-doped semiconductor material, an n-doped semiconductor material, or a combination of semiconductor materials having different types of doping.

III-V compound semiconductors may have a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). II-VI compound semiconductors may have a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). In addition, multiple layers of the semiconductor materials may be used as the semiconductor material of the substrate. In some embodiments, the substrate 102 includes both semiconductor materials and dielectric materials. The semiconductor substrate 102 may also comprise an organic semiconductor or a layered semiconductor such as, for example, Si/SiGe, a silicon-on-insulator or a SiGe-on-insulator. The semiconductor substrate 102 may be doped, undoped or contain doped regions and undoped regions therein. The semiconductor substrate 102 may have regions with strain and regions without strain therein or have regions of tensile strain and compressive strain.

A first of the plurality of sacrificial layers 104 is formed in contact with the substrate 102. A second of the plurality of sacrificial layers 106 is formed on and in contact with the first sacrificial layer 104. In embodiments, where the substrate 102 is a bulk substrate, the plurality of sacrificial layers 104, 106 may be formed in contact with the substrate 102. Alternatively, in embodiments where the substrate 102 is an SOI substrate the plurality of sacrificial layers 104, 106 may be formed in contact with the insulating layer formed on the substrate 102.

In one embodiment, the first sacrificial layer 104 may be formed by epitaxially growing a semiconductor material on and in contact with the substrate 102 (or insulating layer if formed). In one example, the first sacrificial layer 104 may comprise a silicon germanium (SiGe) layer epitaxially grown with a 55% concentration of germanium (Ge). However, other concentrations of germanium are applicable as well. The second sacrificial layer 106 may be formed by epitaxially growing a semiconductor material on and in contact with the first sacrificial layer 104. In one example, the sacrificial layer 104 may comprise a silicon germanium (SiGe) layer epitaxially grown with a 25% concentration of germanium (Ge). However, other concentrations of germanium are applicable as well. The different concentrations of germanium within the first sacrificial layer 104 and the second sacrificial layer 106 allows the first sacrificial layer 104 to be removed selectively to the second sacrificial layer 106. As will be discussed in greater detail below, the second sacrificial layer 106 may be used to form a bottom isolation layer.

The terms "epitaxial growth", "epitaxial deposition", "epitaxially formed", "epitaxially grown", and their variants mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

The terms "epitaxially growing", "epitaxial growth", "epitaxially grown", and their variants mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatus that are suitable for use in one or more embodiments include, e.g., rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). A number of different sources can be used for the deposition of the various layers discussed herein. For example, the gas source for the deposition of epitaxial semiconductor material can include a silicon containing gas source, a germanium containing gas source, a combination thereof, and/or the like. Examples of silicon containing gas sources are silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. Examples of germanium containing gas sources are germane, digermane, halogermane, dichlorogermane, trichlorogermane, tetrachlorogermane and combinations thereof.

The channel layer 108 comprises one or more semiconductor materials from which vertically oriented nanosheets/nanowires will be subsequently formed for pFET devices, nFET devices, or a combination of both. The terms "nanosheets" and "nanowires" may be used interchangeable and refer to a sheet or a layer having nanoscale dimensions. A nanosheet may refer to a nanowire with a larger width, and/or nanowire may be used to refer to a nanosheet with a smaller width, and vice versa. In one embodiment, the channel layer 108 may comprise silicon but other materials are applicable as well. In some embodiments, the materials of the sacrificial layers 104, 106 and the channel layer 108 are such that the sacrificial layers 104, 106 may be removed selective to the channel layer 108 (and vice versa).

The etch stop layer 110 may be formed on and in contact with channel layer 108. In one embodiment, the etch stop layer 110 may comprise a dielectric material or other material that may be utilized as an etch stop material. Examples of etch stop materials include (but are not limited to) silicon carbide and silicon oxycarbide. The mandrel layer(s) 112 may be formed by depositing a hardmask material such as silicon nitride on the etch stop layer 110. The hardmask material may then be patterned using one or more known patterning techniques to form the mandrel layer(s) 112 over one or more portions of the underlying structure for defining multiple vertically oriented nanosheet devices.

Figure 2:
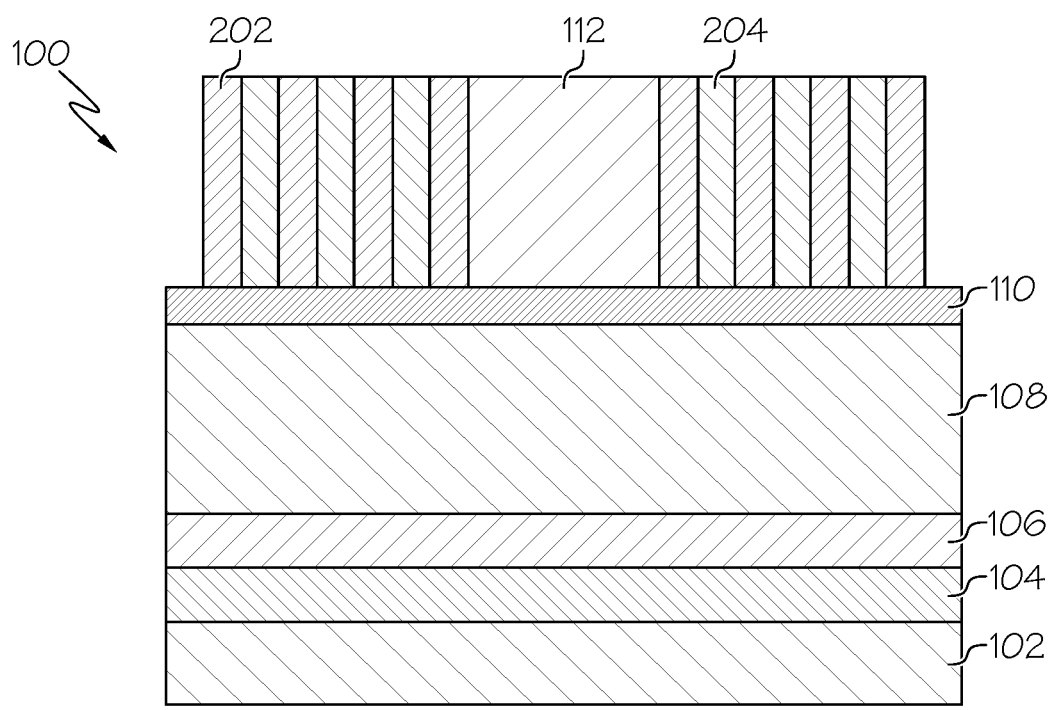
FIG. 2 is a cross-sectional view of the semiconductor structure after first and second alternating patterns of first and second spacers have been formed on opposing sides of the mandrel layer according one embodiment of the present invention.

A plurality of alternating spacers comprising a first plurality of spacers 202 and a second plurality of spacers 204 is then formed in contact with the etch stop layer 110 and the mandrel layer 112 as shown in FIG. 2. In one embodiment, the plurality of alternating spacers may be formed by conformally depositing a first spacer material such as (but not limited to) amorphous silicon (a-Si) over the structure and in contact with a top surface of the etch stop layer 110. The first spacer material may then be etched using an anisotropic etching process. A second spacer material such as (but not limited to) silicon dioxide (SiO2) may then be conformally deposited over the structure and etched using an anisotropic etching process similar to the first spacer material. By repeating these processes, an alternating pattern of the first plurality of spacers 202 comprising the first spacer material and the second plurality of spacers 204 comprising the second spacer material may be formed. In at least some embodiments the first spacer material is different than the second spacer material. Also, in one or more embodiments, the vertical (height) dimension of one or more of the alternating spacers 202, 204 may be greater than its corresponding horizontal (width) dimension.

It should be noted that various materials may be used for forming the mandrel 112, the first plurality of spacers 202, and the second plurality of spacers 204 such that each of these features may be selectively etched with respect to each other. For example, a combination of silicon, silicon dioxide, and silicon nitride may be utilized. In other examples, combinations such as silicon, titanium oxide, and silicon oxide; silicon, titanium oxide, and silicon nitride; silicon dioxide, titanium oxide, and silicon nitride; aluminum oxide, silicon dioxide, and silicon nitride; aluminum oxide, silicon, and silicon oxide; and/or the like may be used to form the silicon, titanium oxide.

FIG. 2 shows an example were three of the second set of spacers 204 have been formed at both the left and right sides of the mandrel 112. However, embodiments of the present invention are not limited to such an example. For instance, when the circuit requires an asymmetric effective gate width, one side of the spacers may be masked and some spacers may be removed from the exposed side. For example, one layer of the first set of spacers 202 and the second set of spacers 204 may be removed from the right side of the spacer arrays so that two layers of the second set of spacers 204 remain. In other embodiments, more or less than the number of first spacers 202 and second spacers 204 shown in FIG. 2 may be formed.

Figure 3:
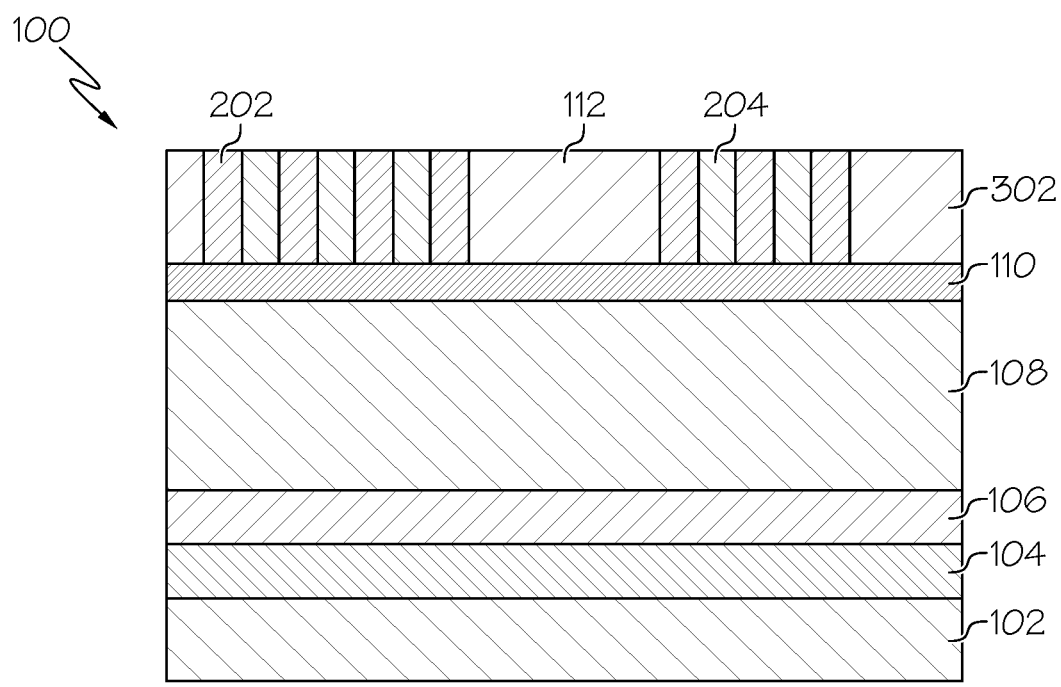
FIG. 3 is a cross-sectional view of the semiconductor structure after a hard mask material has been deposited and a polishing process has been performed according one embodiment of the present invention.
Figure 4:
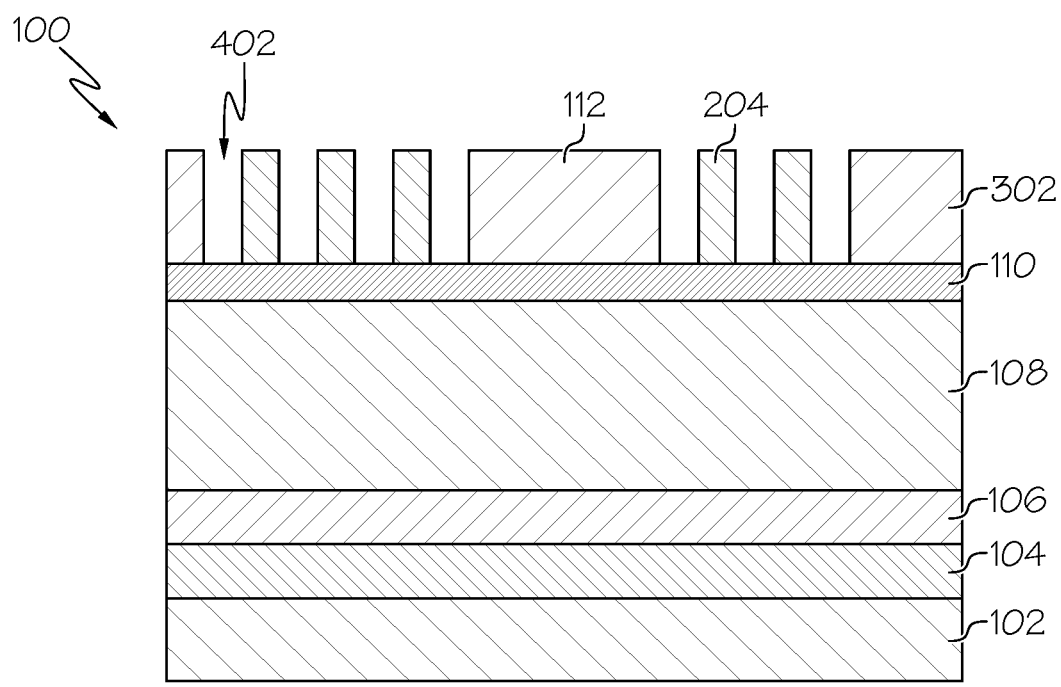
FIG. 4 is a cross-sectional view of the semiconductor structure after the first spacers have been removed according one embodiment of the present invention.

FIG. 3 shows the structure 100 after one or more of the first spacers 202 and/or second spacers 204 have been optionally removed using a typically patterning and etching process. FIG. 3 further shows that a hardmask material fill process may be performed to form additional hardmask layers 302 on exposed portions of the etch stop layer 110. A polishing process such as CMP may be performed to polish down the mandrel 112; remaining first/second spacers 202, 204; and hardmask layers 302. The first plurality of spacers 202 may then be removed by a selective etching process such as reactive ion etching (RIE) as shown in FIG. 4. The removal of the first plurality of spacers 202 forms a plurality of trenches 402 exposing portions of the top surface of the underlying etch stop layer 110; sidewalls of the mandrel 112; sidewalls of the second spacers 204; and sidewalls of the hardmask layers 302.

Figure 5:
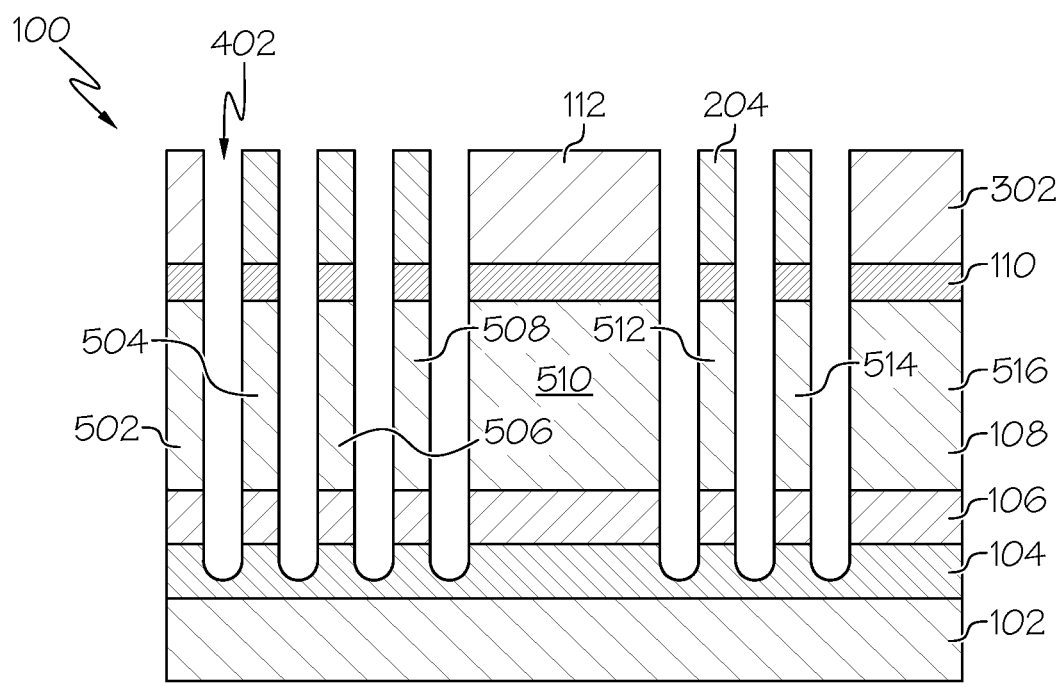
FIG. 5 is a cross-sectional view of the semiconductor structure after trenches have been formed down into the semiconductor stack to define vertically oriented nanosheets according one embodiment of the present invention.

FIG. 5 shows that an additional etching process may then be performed to extend the plurality of trenches 402 down into the first sacrificial layer 104. RIE or another suitable etching process may be utilized to extend the trenches 402. In one embodiment, the etching process continues down through the top surface of the first sacrificial layer 104 but stops prior to etching completely through this layer 104. The extended trenches 402 expose a portion of the first sacrificial layer 104 and sidewalls of the second sacrificial layer 106, sidewalls of the channel layer 108, sidewalls of the etch stop layer 110, sidewalls of the plurality of second spacers 204, sidewalls of the mandrel 112, and sidewalls of the hardmask material layers 302. The etching of the channel layer 108 forms a plurality channel layer portions 502 to 516. As will be discussed in greater detail below, one or more of the channel layer portions 502 to 516 will become vertically oriented nanosheets. In some embodiments, the width of the trenches 402 defines the spacing between subsequently formed vertically oriented nanosheets. However, the spacing between the vertically oriented nanosheets may also be influenced by subsequent processes such as gate insulator pre-cleaning, which may thin down the nanosheet sidewalls.

Figure 6:
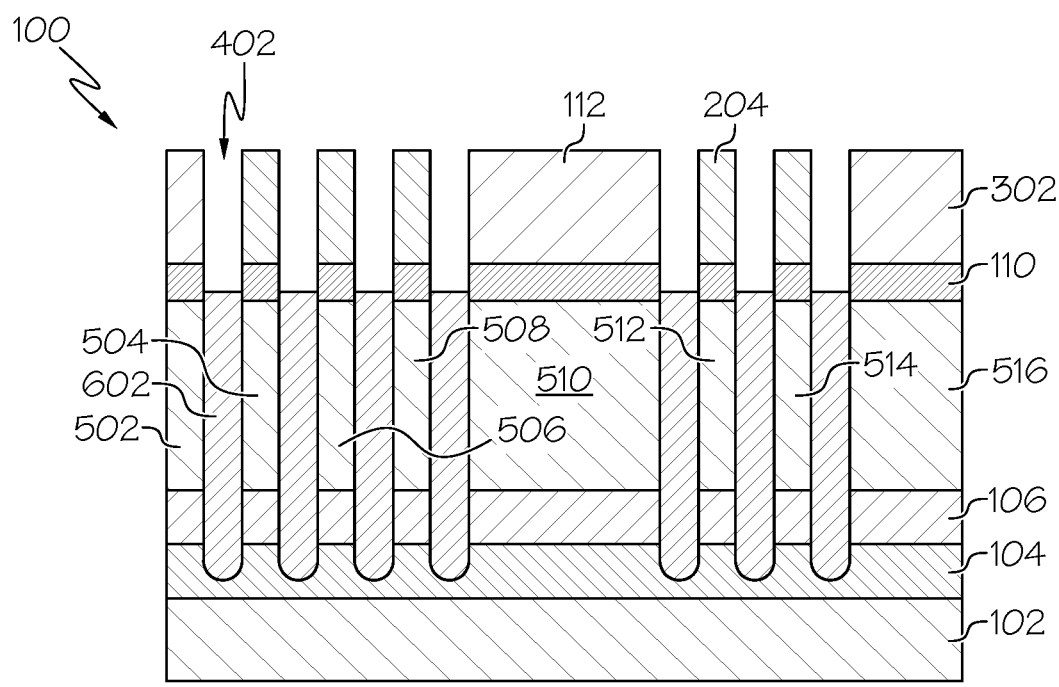
FIG. 6 is a cross-sectional view of the semiconductor structure after sacrificial spacers have been formed between the vertically oriented nanosheets according one embodiment of the present invention.

Additional sacrificial semiconductor material may then be deposited within the trenches 402 to form sacrificial nanosheet spacers 602 as shown in FIG. 6. For example, a deposition process such as (but not limited to) ALD, epitaxy, and/or the like may be used to deposit a sacrificial semiconductor material such as SiGe within the trenches 402. The additional sacrificial semiconductor material may then be recessed within the trenches 402 using an etching process such as RIE. In one embodiment, the additional sacrificial semiconductor material may be recessed down to or above a bottom surface of the etch stop layer 110. The sacrificial nanosheet spacers 602 may contact a bottom surface and inner sidewalls of the etched portion of the first sacrificial layer 104; sidewalls of the second sacrificial layer 106; and sidewalls of the channel layer portions 502 to 516. In some embodiments, the sacrificial nanosheet spacers 602 may also contact a portion of exposed sidewalls of the etch stop layer 110 as well. The sacrificial nanosheet spacers 602 may comprise a material similar to the second sacrificial layers 106 such as SiGe with a 25% concentration of germanium although other concentrations are applicable as well.

Figure 7:
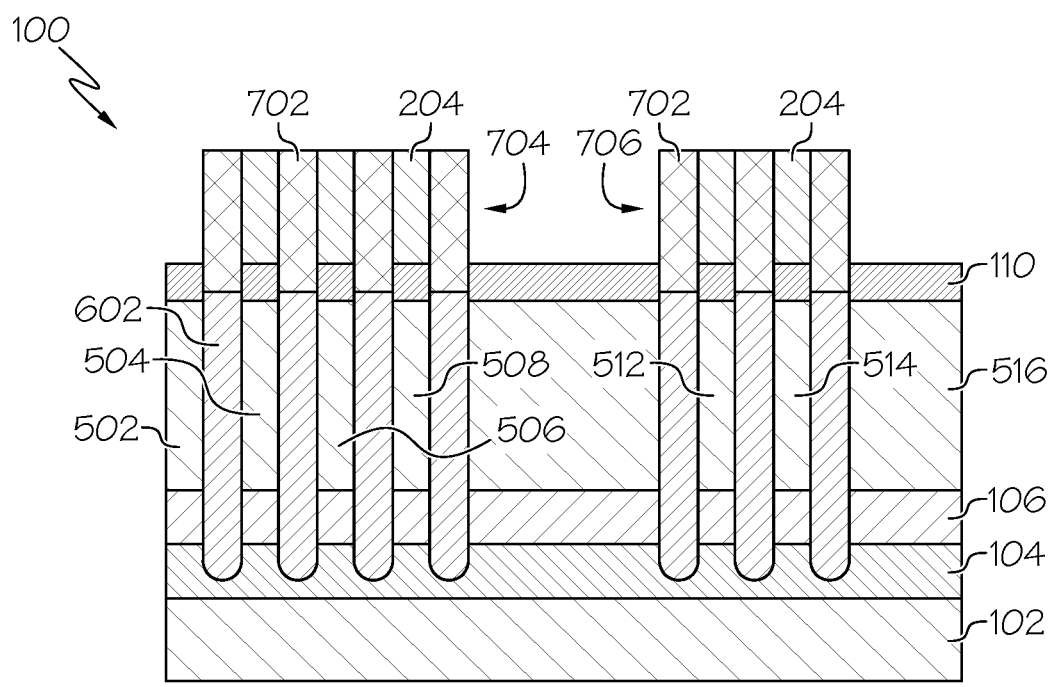
FIG. 7 is a cross-sectional view of the semiconductor structure after gaps between the second spacers have been filed in and the mandrel/hardmask layers have been removed according one embodiment of the present invention.

FIG. 7 shows that an additional spacer material 702 may then be deposited within and filling the remaining portions of the trenches 402, and the mandrel 112 and hardmask material layers 302 may then be selectively removed. The additional spacer material 702 may be similar to the material of the second spacers 204. For example, the additional spacer material 702 may comprise (but is not limited to) silicon dioxide and may be deposited by, for example, ALD. The combination of the second spacer 204 and the additional spacer material 702 is herein referred to as "disposable spacers 704, 706". Excess additional spacer material may be removed by, for example, CMP such that a top surface of the disposable spacers 704, 706 is planar with a top surface of the mandrel 112 and hardmask material layers 302. After the disposable spacers 704, 706 have been formed, the mandrel 112 and hardmask material layers 302 may be selectively removed via one or more etching processes thereby exposing a portion of the underlying top surface of the etch stop layer 110 and sidewalls of the spacers 704, 706.

Figure 8:
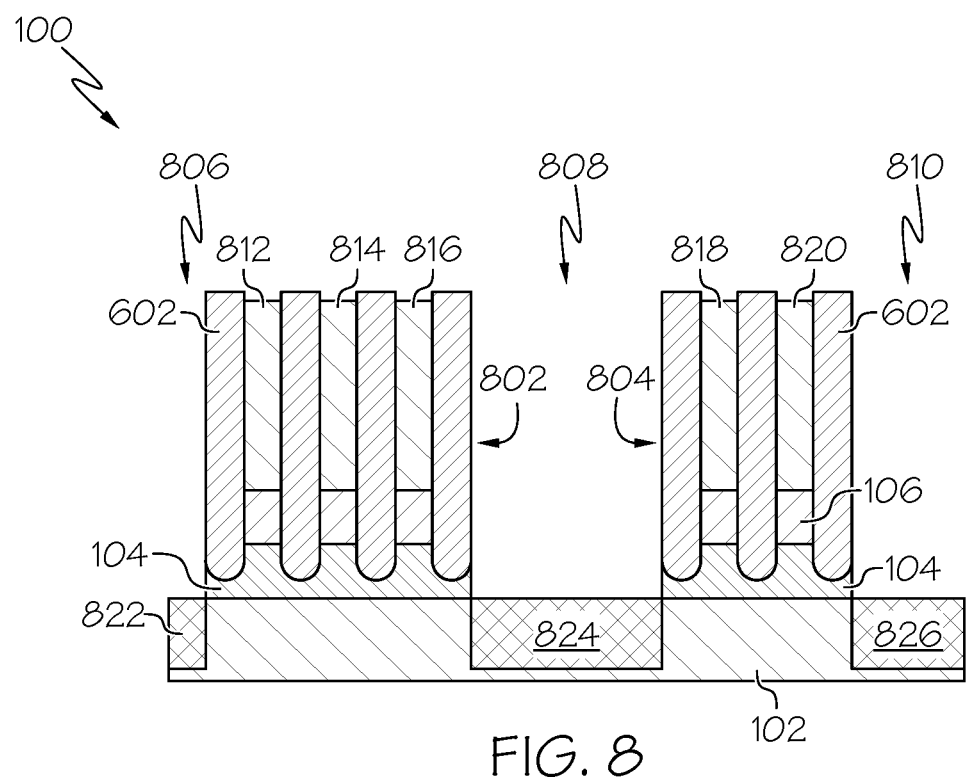
FIG. 8 is a cross-sectional view of the semiconductor structure after exposed portions of the semiconductor stack have been etched according one embodiment of the present invention.
Figure 9:
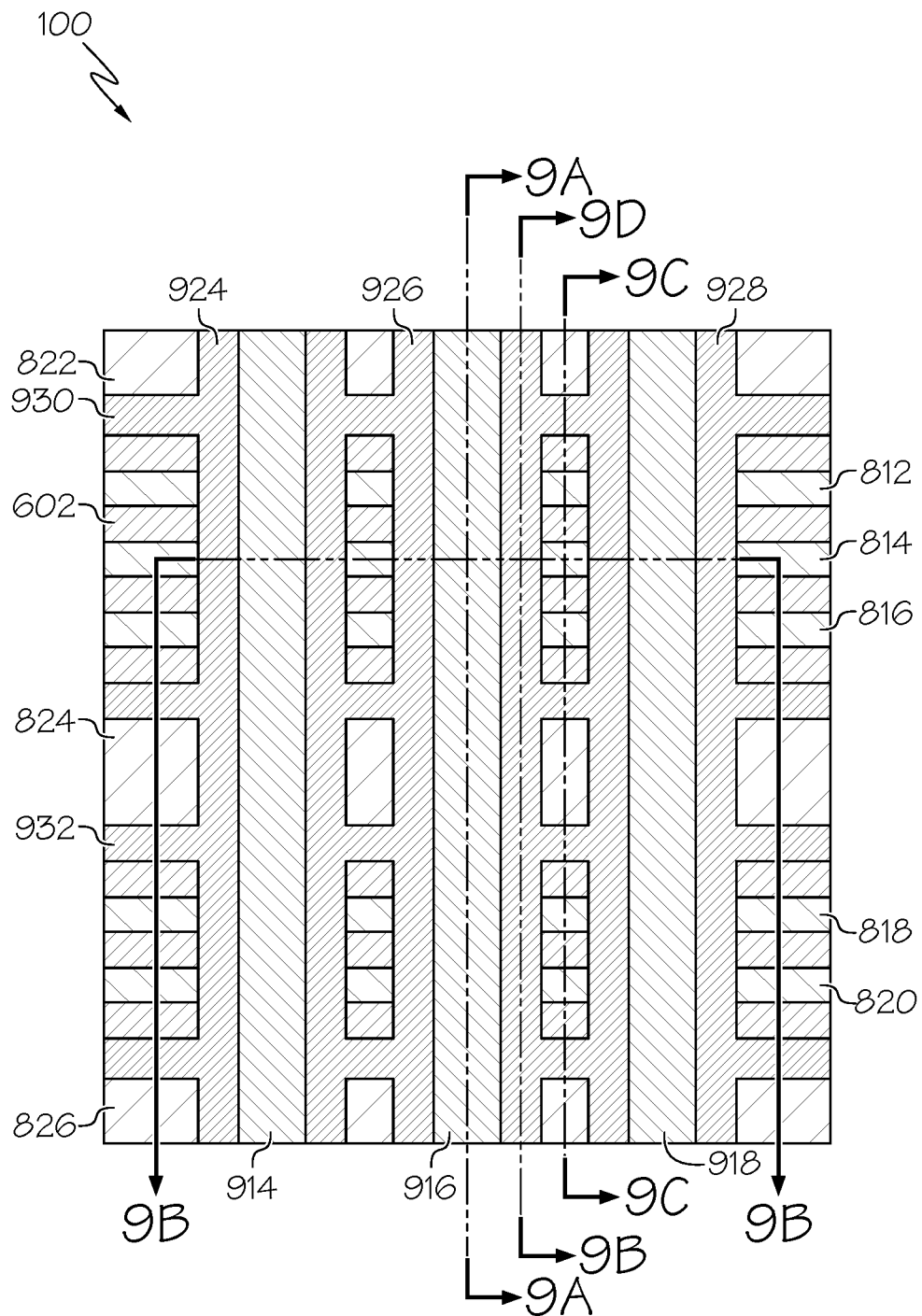
FIG. 9 is a top view of the semiconductor structure after a disposable gate structure, gate spacers, and a bottom dielectric isolation layer have been formed according one embodiment of the present invention.
Figure 9A:
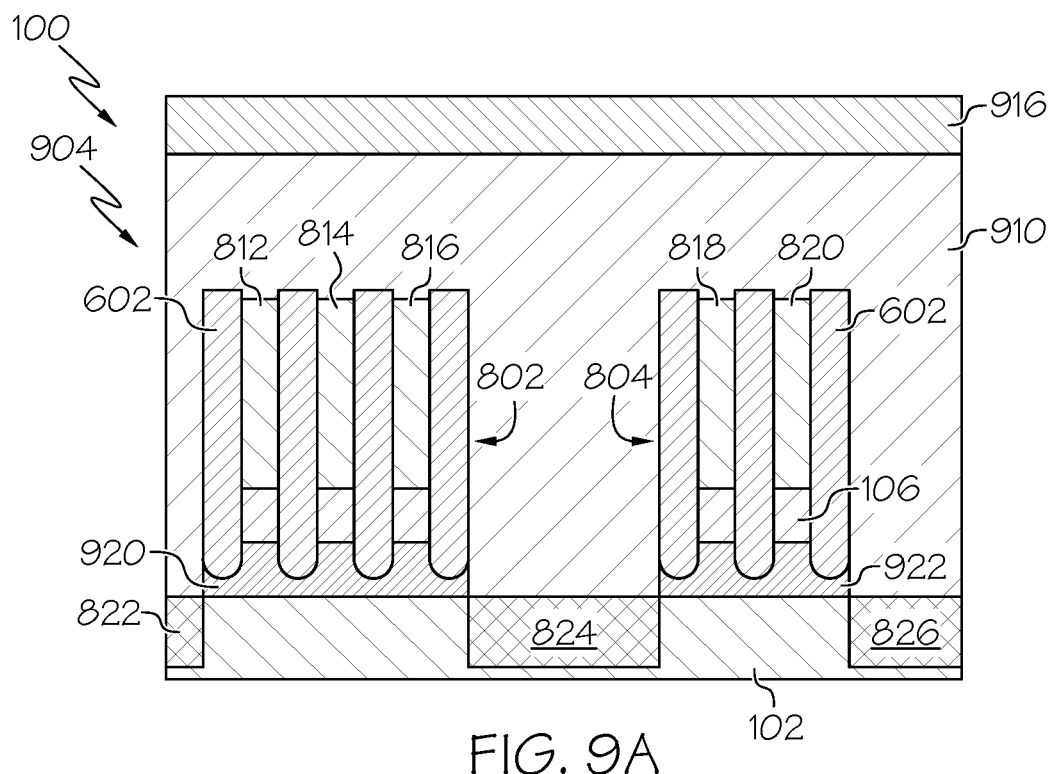
FIGS. 9A to 9D are various cross-sectional views of the semiconductor structure after a disposable gate structure, gate spacers, and a bottom dielectric isolation layer have been formed according one embodiment of the present invention.
Figure 9B:
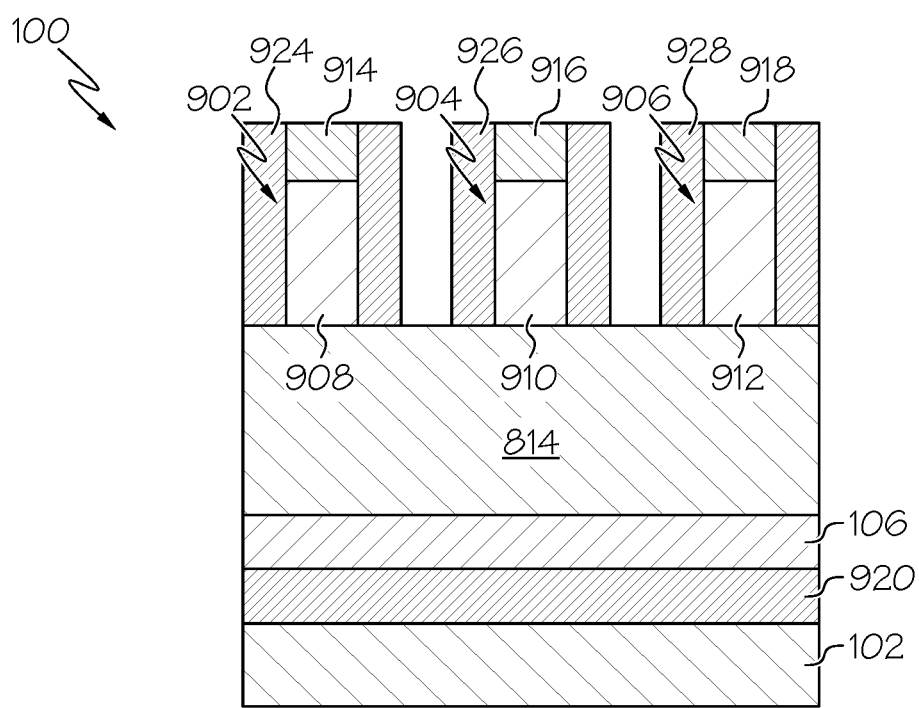
Figure 9C:
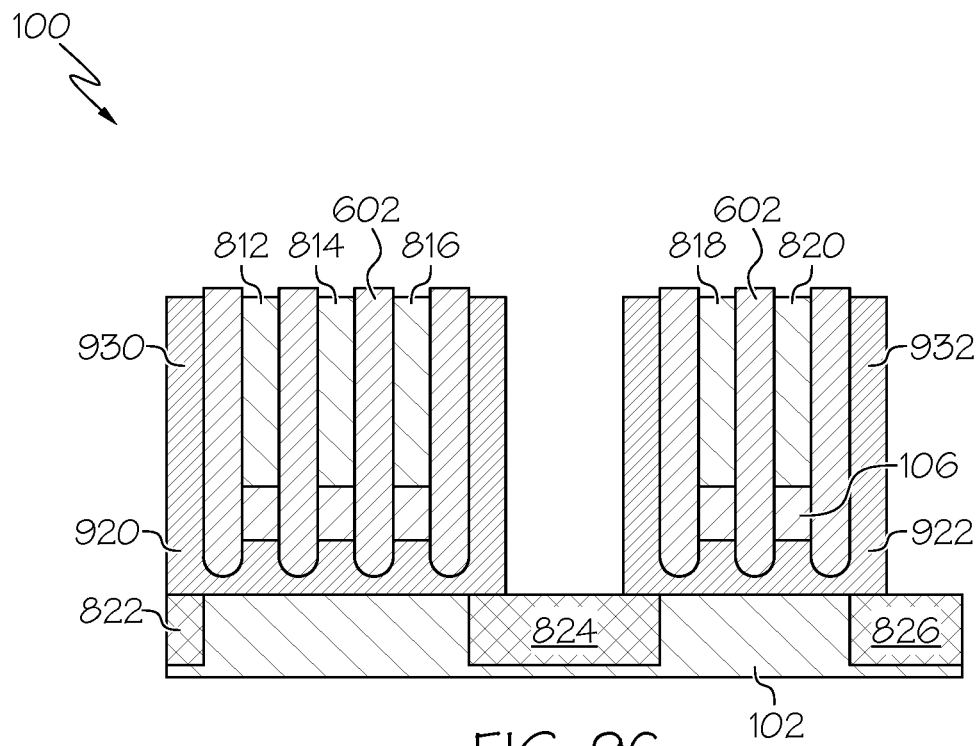
Figure 9D:
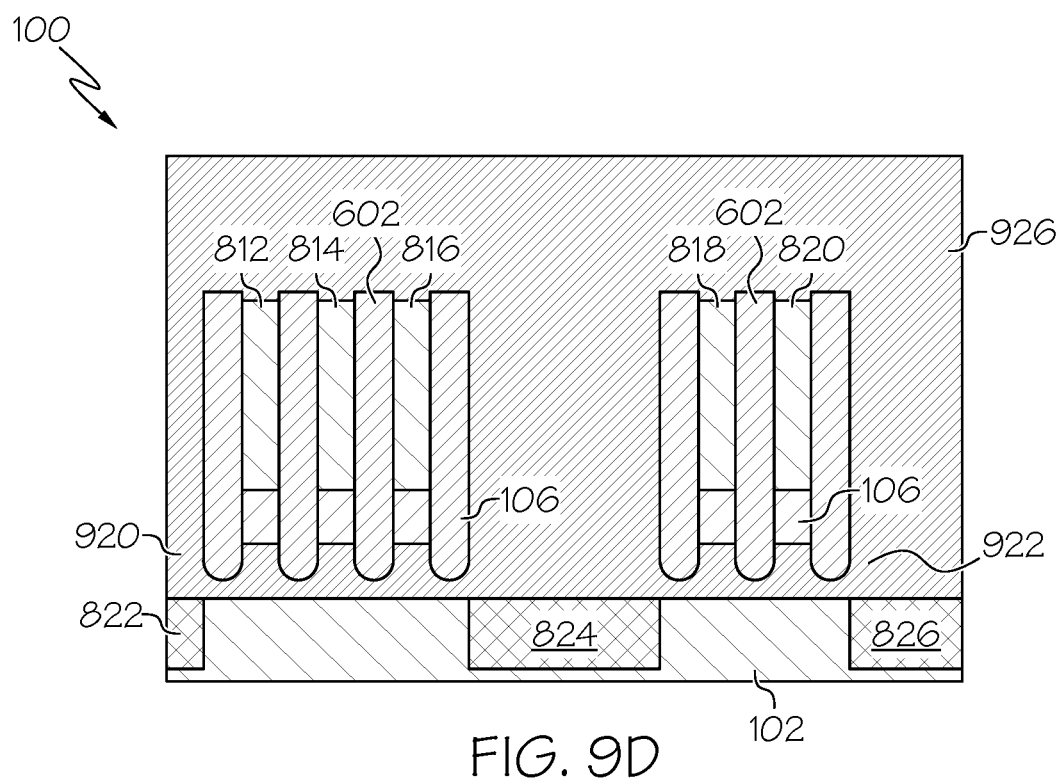

Portions of the structure not underlying the disposable spacers 704, 706 may then be selectively etched to form a plurality of nanosheet stacks 802, 804 as shown in FIG. 8. For example, an etching process such as RIE may be used to etch portions of the substrate 102; first sacrificial layer 104; second sacrificial layer 106; sacrificial nanosheet spacers 602; and channel layer portions 502, 510, 516 that do not underlie the disposable spacers 704, 706. This etching process may etch down into, but not through, the substrate 102 thereby forming trenches 806 to 810. In some embodiments, one or more of the nanosheet stacks 802, 804 are pFET device stacks and one or more of the remaining nanosheet stacks 802, 804 may be nFET device stacks.

In one embodiment, each of the nanosheet stacks 802, 804 comprises vertically oriented nanosheets 812 to 820 and is horizontally oriented such that the nanosheets 812 to 820 of each stack are adjacent to each other. The vertically oriented nanosheets 812 to 820 comprise the remaining channel layer portions 504, 506, 508, 512, and 514. The nanosheets 812 to 820 are referred to as "vertically oriented nanosheets", "vertically oriented adjacent nanosheets", or "vertical nanosheets" since they are situated horizontally adjacent to each other instead of on top of each other, and because their vertical (height) dimension is greater than their horizontal (width) dimension. In at least some embodiments, the spacing between each nanosheet may be, for example, 4 nm to 15 nm although other widths are applicable as well. The sacrificial nanosheet spacers 602 are disposed at the ends of the vertically oriented nanosheets 812 to 820 and interleaved there between.

FIG. 8 further shows that a dielectric material (e.g. SiO2, or a thin liner of SiN followed by SiO2 fill) may be formed/deposited over the entire structure 100 and within the trenches 806 to 810. The dielectric material may be a flowable oxide or another type of oxide. The dielectric material may be overfilled and then polished back, followed by recess to form one or more isolation regions 822 to 826. The top surface of the dielectric material may be recessed to be planar with a top surface of the substrate 102. In other embodiments, the top surface of the dielectric material may be above the top surface of the substrate 102. FIG. 8 also shows that a nanosheet reveal process may then be performed that removes the disposable spacers 704, 706 and etch stop layer 110 thereby exposing the underlying vertically oriented nanosheets 812 to 820 and sacrificial nanosheet spacers 602. An isotropic etching process such as dry vapor recess, a wet etch process such as BHF, or other applicable etching process may be used to perform the reveal process.

One or more disposable/dummy gate structures 902 to 906 are then formed over the structure 100 as shown in FIGS. 9 to 9D. In one embodiment, the disposable gate structures 902 to 906 are formed over and across (wrapping) portions of the nanosheet stacks 802, 804 that will serve as a channel region(s) of the device(s). In one embodiment, the disposable gate structures 902 to 906 may comprise a disposable gate portion 908 to 912 and a disposable gate cap 914 to 918. In one embodiment, the disposable gate portion 908 to 912 may comprise a sacrificial material. For example, the disposable gate portion 908 to 912 may comprise amorphous carbon, amorphous silicon, diamond-like carbon (DLC), a dielectric metal oxide, silicon nitride, or an organosilicate glass. Alternatively, the disposable gate portion 908 to 912 may include a stack of a disposable material liner (not shown) and a disposable gate material portion (not shown). In this case, the disposable material liner may include a dielectric material such as silicon oxide. The disposable gate material portion, in one embodiment, may include a dielectric material, a semiconductor material, or a conductive material, provided that the disposable gate material portion is able to be removed selective to the dielectric materials of a planarization dielectric layer and a gate spacer to be subsequently formed.

The disposable gate cap 914 to 918 may include a material such as silicon nitride and may be a bi-layer cap (e.g., nitride-oxide). The disposable gate structures in one embodiment, may be formed by deposition and patterning of at least one material layer. The patterning of the at least one material layer may be performed by a combination of lithographic methods and an anisotropic etch.

FIGS. 9 to 9D further show that after the disposable gate structure 902 to 906 has been formed, the first sacrificial semiconductor layer 104 may be removed and a bottom dielectric isolating (BDI) layer 920, 922 and spacers 924 to 932 may be formed. The first sacrificial semiconductor layer 104 may be removed using, for example, an isotropic etch (e.g., wet chemical etch, dry plasma etch, gas phase etch, etc.), where the isotropic etch selectively etches laterally into the first sacrificial semiconductor layer 104. This etching process forms a cavity between the substrate 102 and a bottom portion of the second sacrificial layer 106.

ALD or another applicable deposition process is utilized to perform a spacer liner deposition process followed by spacer RIE. The deposition process also fills the cavity between the substrate 102 and a bottom portion of the second sacrificial layer 106 with spacer material. These process form the BDI layers 920, 922 and spacers 924 to 932, which comprise silicon nitride (SiN), silicon boron carbonitride (SiBCN), silicon oxycarbonitride (SiOCN), silicon oxynitride (SiON), silicon carbide (SiC), and/or the like. The BDI layers 920, 922 may contact a top surface of the substrate 102; a bottom surface of the second sacrificial layer 106; and portions of the sacrificial nanosheet spacers 602 that extend below the second sacrificial layer 106.

The spacers 924 to 928 may be gate spacers and formed in contact with sidewalls of the disposable gate structures 902 to 906. FIG. 9C shows that spacers 930, 932 are also formed in contact the outer sidewalls of the nanosheet spacers 602 in source/drain regions adjacent to the disposable gate structures 902 to 906 and gate spacers 924 to 928. FIG. 9D shows that, in one embodiment, the combination of the BDI layers 920, 922 and the gate spacers 924 to 928 may completely surround a portion of the nanosheet stacks 802, 804 (including the second sacrificial layer 106 and sacrificial nanosheet spacers 602) that is adjacent to a disposable gate structure 902 to 906.

After the BDI layers 920, 922 and spacers 924 to 932 have been formed, inner spacers 1002 to 1006 are formed as shown in FIGS. 10A to 10D. In one embodiment, the inner spacers 1002 to 1006 may be formed by recessing the structure 100 in the source/drain regions between the gate spacers 924 to 928 shown in FIG. 10B and between spacers 930, 932 as shown in FIG. 10C. For example, exposed portions of the vertically oriented nanosheets 812 to 820 and sacrificial nanosheet spacers 602 and underlying portions of the second sacrificial layer 106 may be etched away using for example, RIE. This process exposes sidewalls of the portions of the vertically oriented nanosheets 812 to 820 and portions of the second sacrificial layer 106 underlying the disposable gate structures 902 to 906 (including the gate spacers 924 to 928). Portions of the top surface of the BDI layer 920, 922 may also be exposed. FIG. 10D further shows that portions of the second sacrificial layer 106 disposed under the gate spacers 924 to 932 and interleaved between the nanosheets 812 to 820 may also be removed.

Figure 10A:
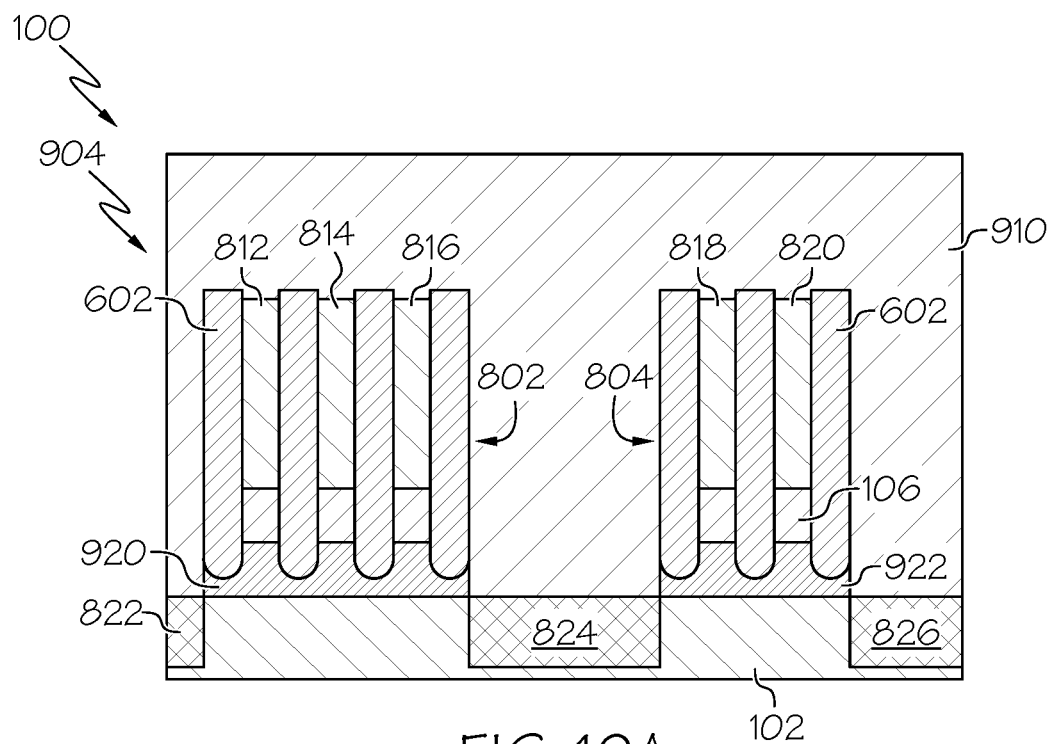
FIGS. 10A to 10D are various cross-sectional views of the semiconductor structure after and inner spacers have been formed according one embodiment of the present invention.
Figure 10B:
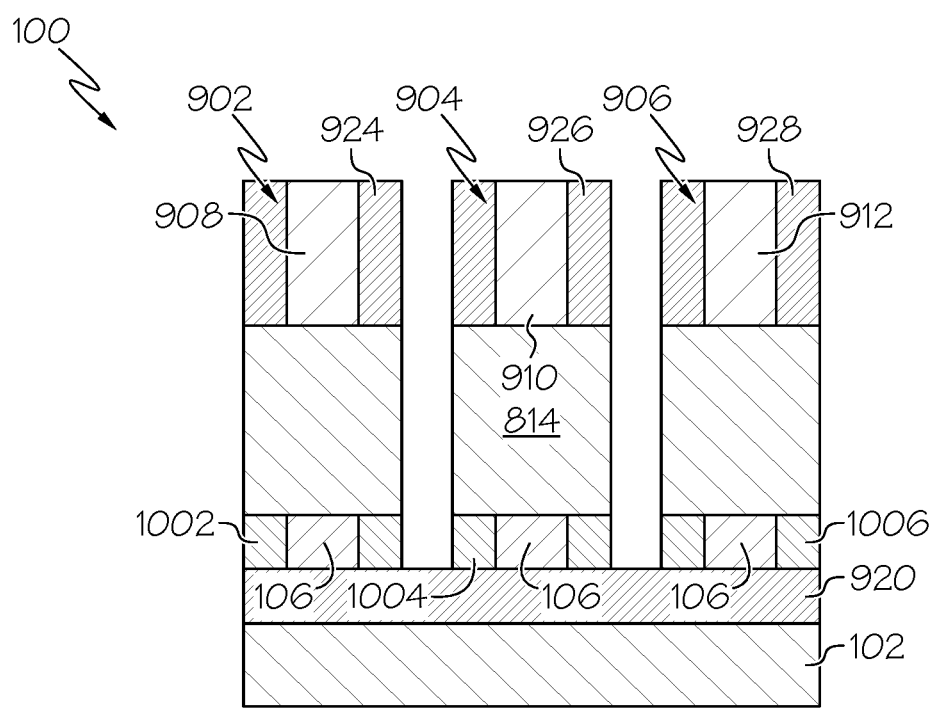
Figure 10C:
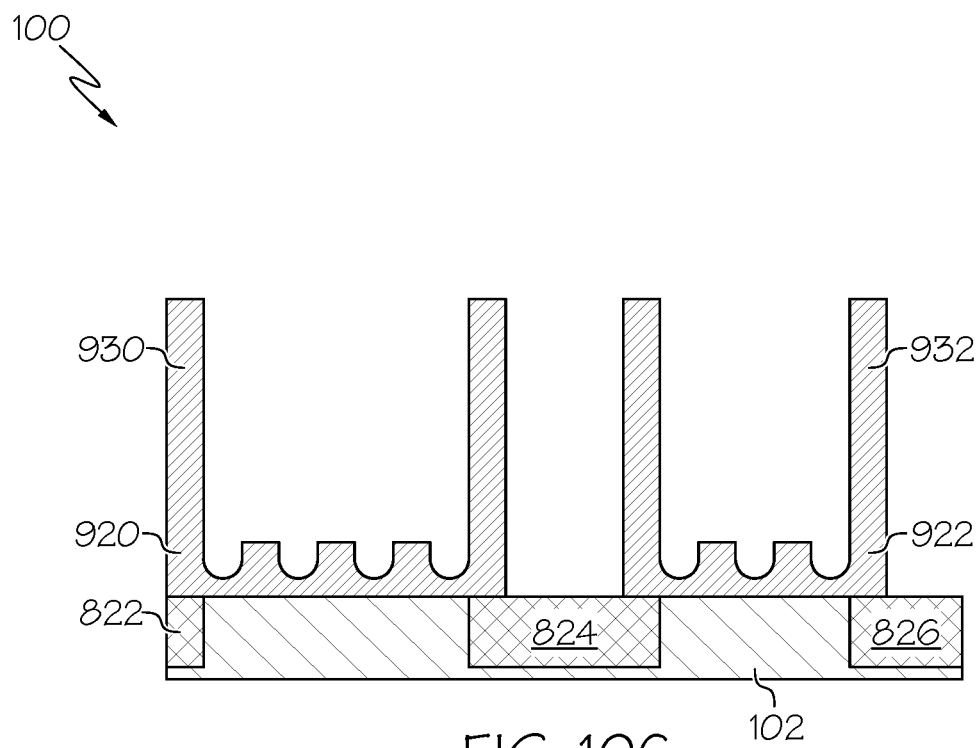
Figure 10D:
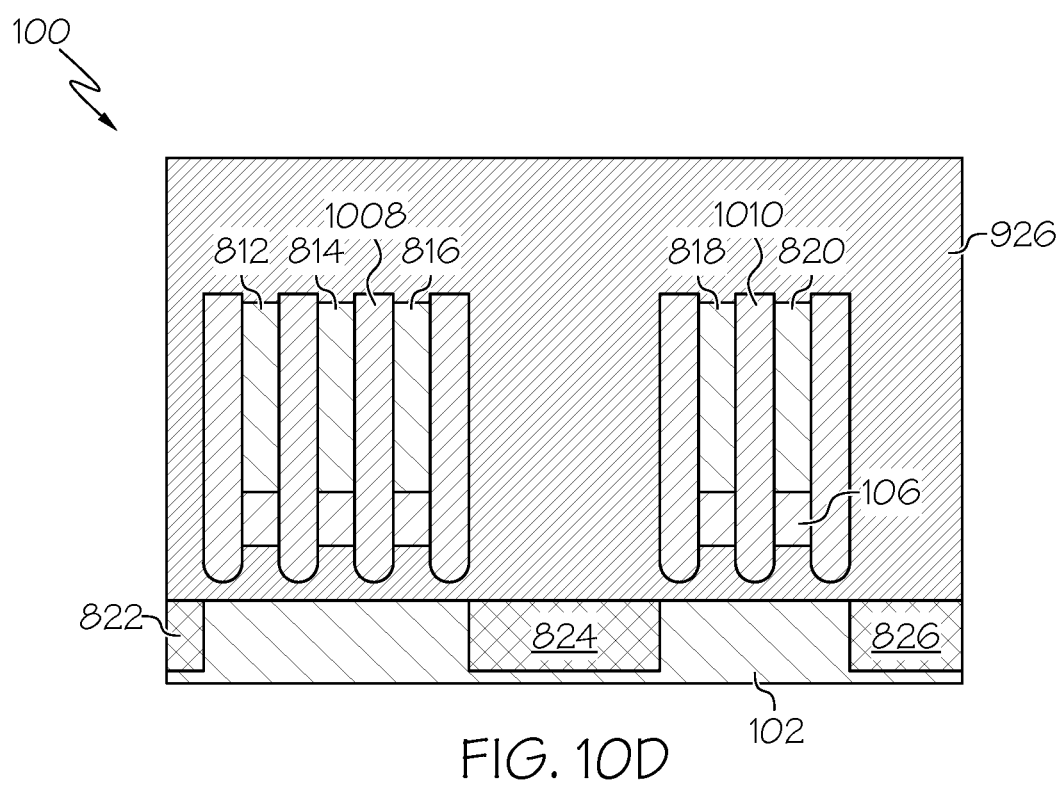

Portions of second sacrificial layer 106 may then be indented to form the inner spacers 1002 to 1006 as shown in FIG. 10B. The inner spacers 1002 to 1006 may be formed by removing portions of the second sacrificial layer 106 underlying the gate spacers 924 to 928. The portion of the second sacrificial layer 106 that is removed reduces the size of this layer 106 in at least one lateral dimension (i.e., length, width). The portions of the second sacrificial layer 106 may be removed using an isotropic etch (e.g., wet chemical etch, dry plasma etch, gas phase etch, etc.), where the isotropic etch etches laterally into the second sacrificial semiconductor material layer 106. The isotropic etch may remove a predetermined amount of material from the second sacrificial layer 106, where the etch may be a timed etch to uniformly remove an equal amount of material from each exposed end. The isotropic etch may form indentations having a predetermined indentation depth into the sacrificial layers. After the etching process, the nanosheet layers may extend passed the second sacrificial layer 106 by a predetermined distance.

A deposition process such as ALD, PEALD, CVD, PECVD, or combinations thereof, may be performed to conformally deposit the inner spacer material within the indentations and form the inner spacers 1002 to 1006. Portions of the inner spacers 1002 to 1006 that extend out beyond the gate spacers 924 to 928 may be removed by a directional etch (e.g., RIE). FIG. 10D further shows that inner spacers 1008, 1010 may be further formed on and in contact with outer sidewalls of nanosheet end portions under the gate spacers 924 to 928 and further interleaved therebetween. In one or more embodiments, the inner spacers 1002 to 1010 may comprise silicon nitride (SiN), a silicon oxide (SiO), silicon oxynitride (SiON), silicon oxycarbide (SiOC), a silicon boro carbonitride (SiBCN), a silicon oxy carbonitride (SiOCN), a silicon carbide (SiC), a high-k metal oxide, a low-k insulator, or suitable combinations thereof.

Figure 11A:
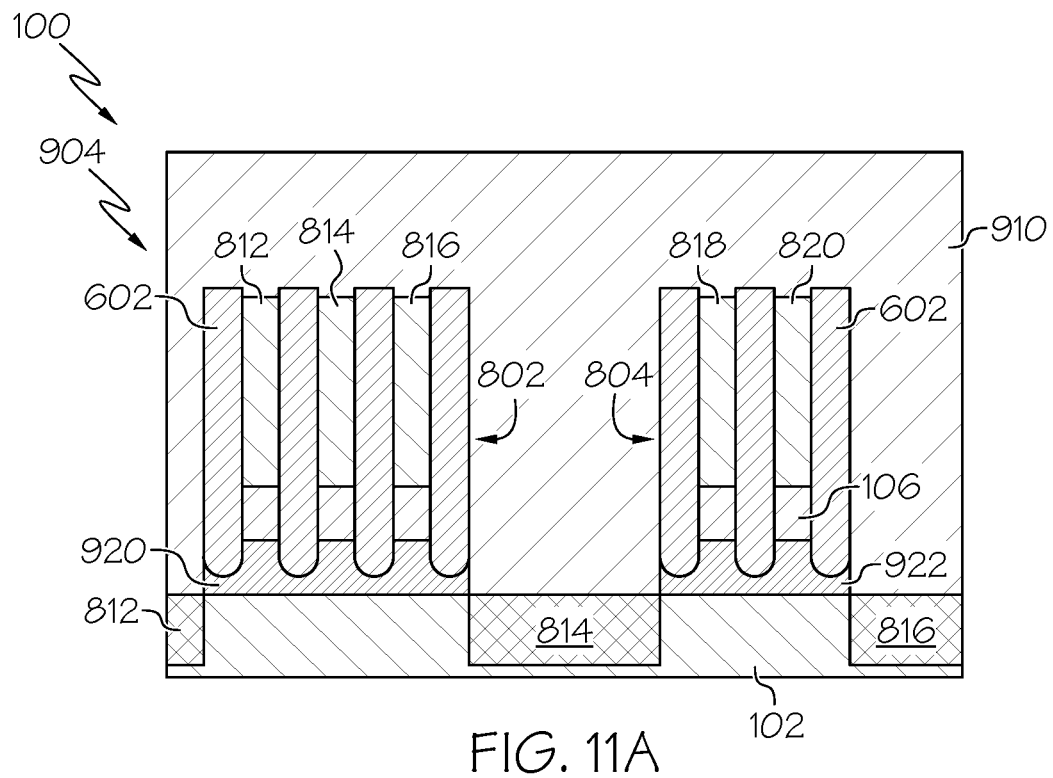
FIGS. 11A to 11C are various cross-sectional views of the semiconductor structure after source and drain layers have been formed according one embodiment of the present invention.
Figure 11B:
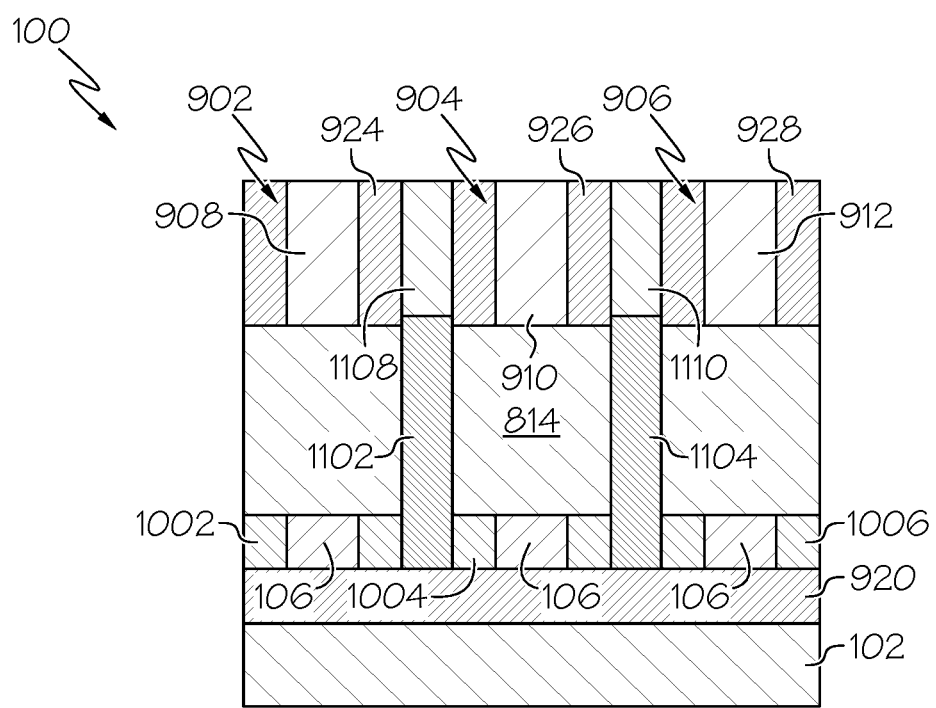
Figure 11C:
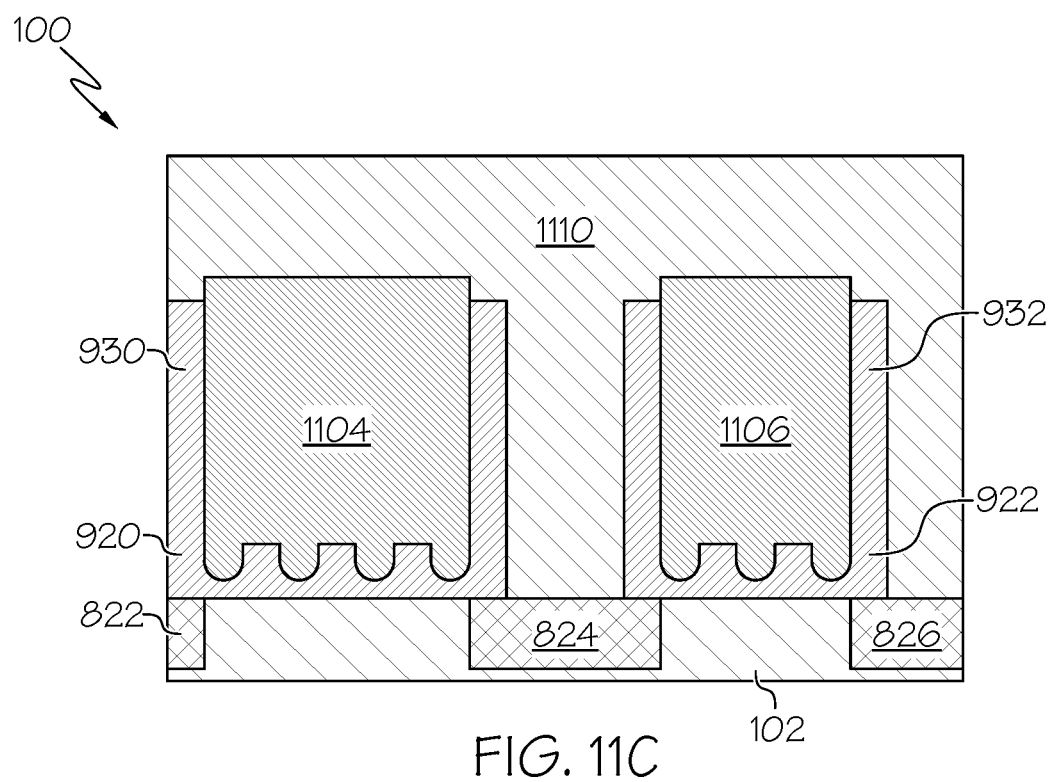

FIGS. 11A to 11C show that source/drain layers 1102 to 1106 may then be formed in the source/drain regions formed by the recessing process discussed above using, for example, a selective epitaxy process. In one embodiment, the ends of the vertically oriented nanosheets 812 to 820 (channel layers) may be used as seeds for the epitaxy process. During the selective epitaxy process, a semiconductor material is deposited only on semiconductor surfaces, and does not nucleate on dielectric surfaces. The source layer may grow from surfaces of the nanosheets 812 to 820 located on one side of the disposable gate structures 902 to 906. The drain layer may grow from surfaces of the vertically oriented nanosheets 812 to 820 located on the other side of the disposable gate structures 902 to 906. A bottom surface of the source/drain layers 1102 to 1106 may be formed on and contact a portion of the top surface of the BDI layer 920, 922. Sidewalls of the source/drain layers 1102 to 1106 may contact sidewalls of the vertically oriented nanosheets 812 to 820 underlying the gate spacers 924 to 928, and may further contact inner sidewalls of the spacers 930, 932 formed in the source/drain regions as shown in FIG. 11C.

Each of the source and drain regions 1102 to 1106 may be single crystalline and may be epitaxially aligned to the single crystalline structure of the nanosheet stacks 812 to 820. The source and drain layers 1102 to 1106, in one embodiment, may be formed with in-situ doping of the electrical dopants, or by deposition of an intrinsic semiconductor material and subsequent introduction of electrical dopants by ion implantation, plasma doping, gas phase doping, or out-diffusion from a disposable doped silicate glass layer. In one embodiment, activation of the dopants forms a sharp junction. It should be noted that one or more embodiments are not limited to the process discussed above for forming the source and drain layers 1102 to 1106.

FIGS. 11A to 11C further show that an inter-layer dielectric (ILD) material may then be deposited over the structure 100 to fill in the cavities where the source/drain layers 1102 to 1106 were formed. The ILD layer may comprise silicon oxide, oxynitride, or other suitable materials. Excess ILD material may be removed by, for example, CMP thereby forming ILD layers 1108, 1110 in contact with a top surface of the source/drain layers 1102 to 1106. The CMP process may stop on the top surface of the disposable gate portion 908 to 912 thereby removing the disposable gate cap 914 to 918 and a portion of the gate spacers 924 to 928.

Figure 12A:
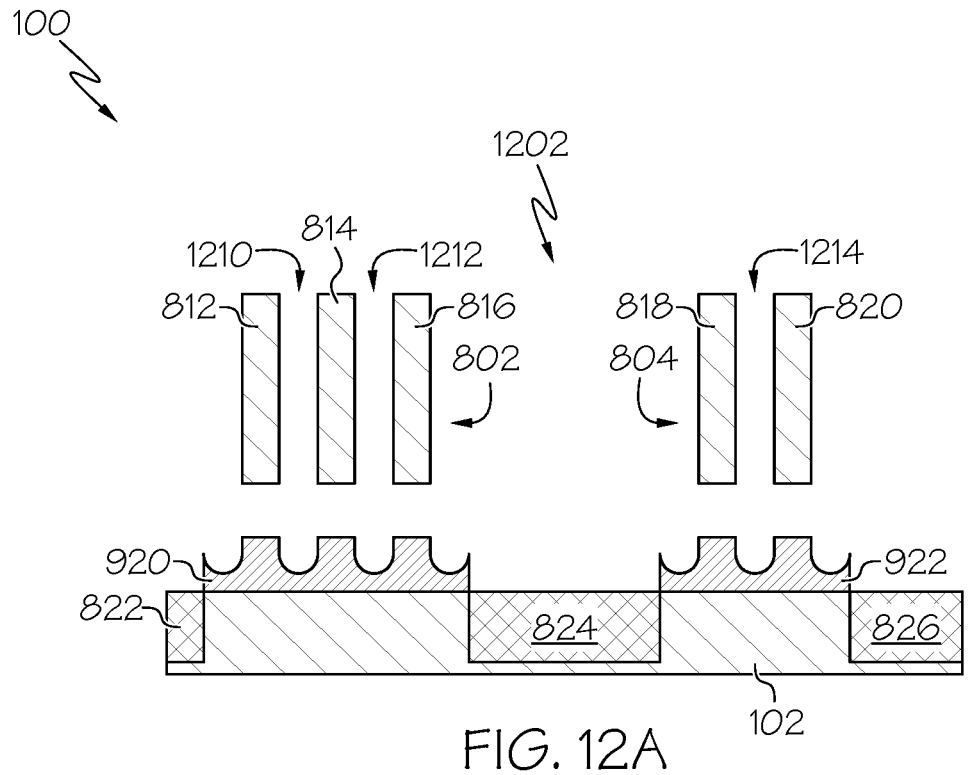
FIGS. 12A and 12B are various cross-sectional views of the semiconductor structure after the disposable gate structures and the sacrificial spacers have been removed according one embodiment of the present invention.
Figure 12B:
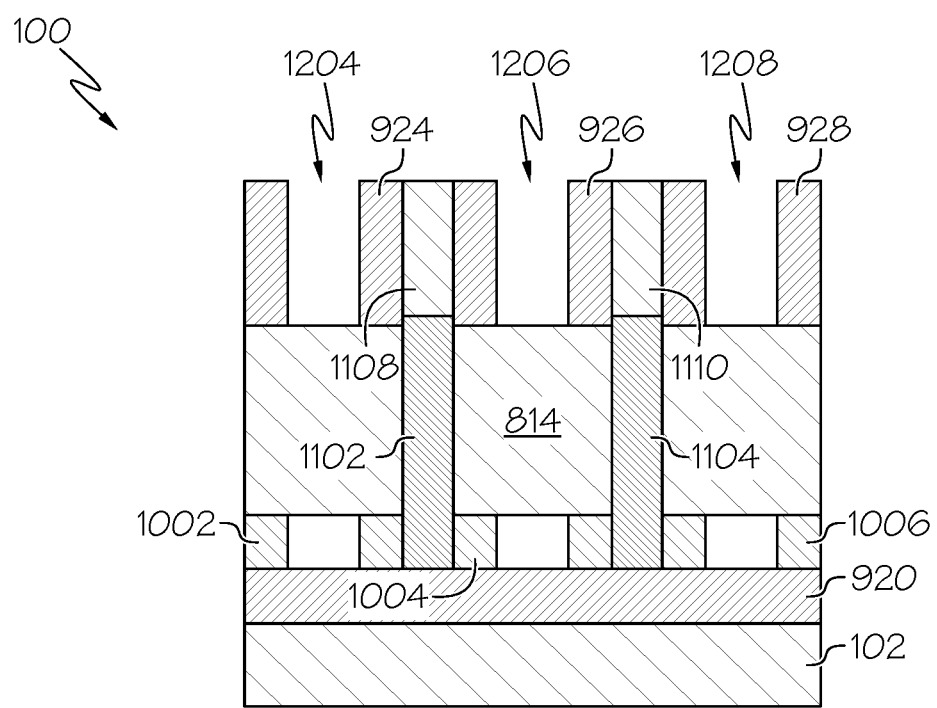

The disposable gate portions 908 to 912 may then be selectively removed via selective etching as shown in FIGS. 12A and 12B. The selective etching process may include, for example, an isotropic etch and/or an anisotropic etch. A gate cavity 1202 to 1208 may be formed in the volume from which the disposable gate structures 902 to 906 were removed. FIGS. 12A and 12B further show that a selective etching process may be performed to remove the remaining portions of the second sacrificial layers 106 selective to the vertically oriented nanosheet channel layers 812 to 820 of each nanosheet stack 802, 804. For example, a wet etch process or a reactive ion etch process can be utilized to selectively remove the second sacrificial layers 106. This process forms cavities 1210 to 1214 between (and adjacent to) each of the vertically oriented nanosheet channel layers 812 to 820, which are anchored by the epitaxy material of the source/drain layers 1102, 1104. Portions of the top surface, bottom surface, and sidewalls of each vertically oriented nanosheet channel layers 812 to 820 may be exposed by the cavities 1202 to 1214.

Figure 13A:
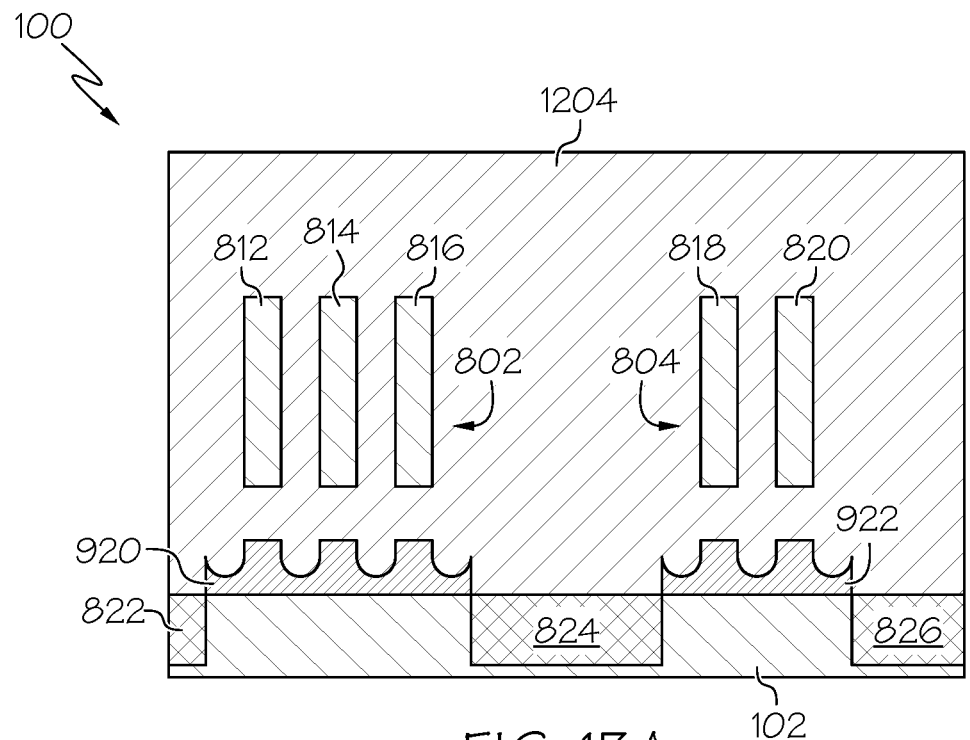
FIGS. 13A and 13B are various cross-sectional views of the semiconductor structure after replacement gate structures have been formed according one embodiment of the present invention.
Figure 13B:
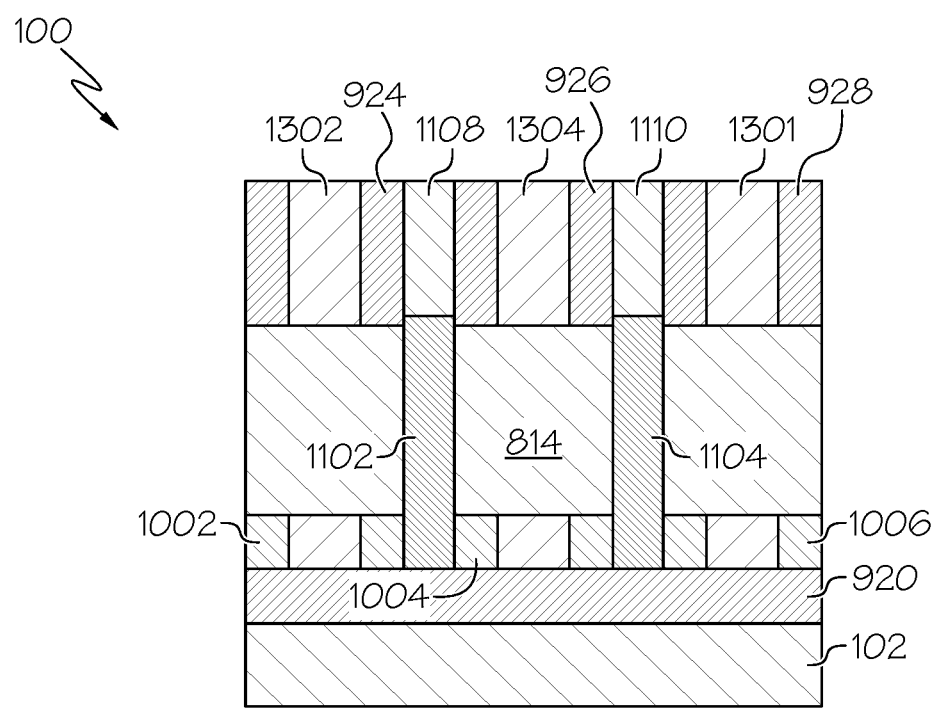

FIGS. 13A to 13B show that a replacement gate fabrication process may then be performed to form one or more replacement gate structures 1302 to 1306 within the gate cavities 1202 to 1208 and surrounding the vertically oriented nanosheet channels 812 to 820 in a gate-all-around (GAA) configuration. In one embodiment, the replacement gate structures 1302 to 1306 may be metal gates. The replacement gate structures 1302 to 1306 may comprise a gate dielectric and a conductive gate electrode. The gate dielectric may be formed on the vertically oriented nanosheet channel layers 812 to 820 prior to placing the conductive gate electrode, so as to separate the channels from the conductive gate electrode.

By way of example, in the case of a metal gate, a suitable gate dielectric may be an insulating dielectric layer, for example, a silicon oxide (SiO), silicon nitride (SiN), silicon oxynitride (SiON), a high-K dielectric, or a suitable combination of these materials. The term "high-κ" as used herein refers to a material having a relative dielectric constant κ which is much higher than that of silicon dioxide (e.g., a dielectric constant κ=25 for hafnium oxide rather than 4 for silicon dioxide. High-K dielectric materials may include, but are not limited to, transition metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k material can further include dopants such as lanthanum and/or aluminum. The stoichiometry of the high-K compounds can vary.

In one embodiment, the conductive gate electrode may be formed by depositing a gate material or combination of materials into the cavities 1202 to 1214 on the gate dielectric. By way of example only, in the case of a metal gate, a combination of gate metals may be used that constitute the conductive gate electrode. For instance, a work function setting metal layer may be deposited onto the gate dielectric, followed by a filler metal layer. The conductive gate electrode and the gate dielectric layer may surround at least a portion of the vertically oriented nanosheet channel layers 812 to 820. The work function layer may be formed on the exposed portion(s) of the gate dielectric layer between the vertically oriented nanosheet channel layers 812 to 820. The work function layer may be formed on the gate dielectric layer to adjust the electrical properties of the conductive gate electrode. In various embodiments, the work function layer may be optional. In one or more embodiments, the work function layer may fill in the spaces between the gate dielectric layers on the vertically oriented nanosheet channel layers 812 to 820. The work function layer may be formed by a conformal deposition, for example, ALD.

In embodiments where both nFETs and pFETs devices are being fabricated, a pFET work function layer is first formed over the structure using the processes discussed above. An OPL layer is then formed over the pFET nanosheet stack(s) leaving the nFET nanosheet stacks exposed. A timed pFET work function metal etch may then be performed to remove the pFET work function layer from the nFET nanosheet stack(s). In at least some embodiments, the work function metal etch utilizes a wet etch chemistry. Because the nanosheets 812 to 820 are vertically oriented and disposed horizontally adjacent to each other the pFET work function layer may be removed from the nFET nanosheet stack(s) without undercutting the OPL formed on the pFET nanosheet stack(s). In particular, a much lower wet etch budget is required to remove the pFET work function metal from between the vertically oriented and horizontally stacked nanosheets 812 to 820 than between conventional horizontally oriented and vertically stack nanosheets. Once the pFET work function layer has been removed an nFET work function layer may then be formed. It should be noted that the nFET work function layer is able to be formed first and removed from the pFET side using a process similar to that discussed above.

In various embodiments, a work function layer may be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer may include multiple layers of work function materials, for example, a work function layer can be a TiN/TiC stack.

The metal fill layer may be formed on the gate dielectric and/or work function layer if present. The metal fill layer, gate dielectric layer, and optionally the work function layer may form a replacement gate structure on the vertically oriented nanosheet channel layers 812 to 820, where the metal fill layer and work function layer form the conductive gate electrode. In various embodiments, the metal fill layer may be blanket deposited on the exposed surfaces of the gate dielectric layer and/or work function layer. In one or more embodiments, the metal fill layer may be a conductive metal, where the metal may be aluminum (Al), gold (Au), silver (Ag), copper (Cu), tungsten (W), titanium (Ti), molybdenum (Mo), cobalt (Co), or a conductive carbon material (e.g., carbon nanotube, graphene, etc.), or any suitable combinations thereof. It should be noted that one or more embodiments are not limited to the process discussed above for forming the replacement gate structures 1302 to 1306. Processing may then be continued to complete the nanosheet devices.

Figure 14:
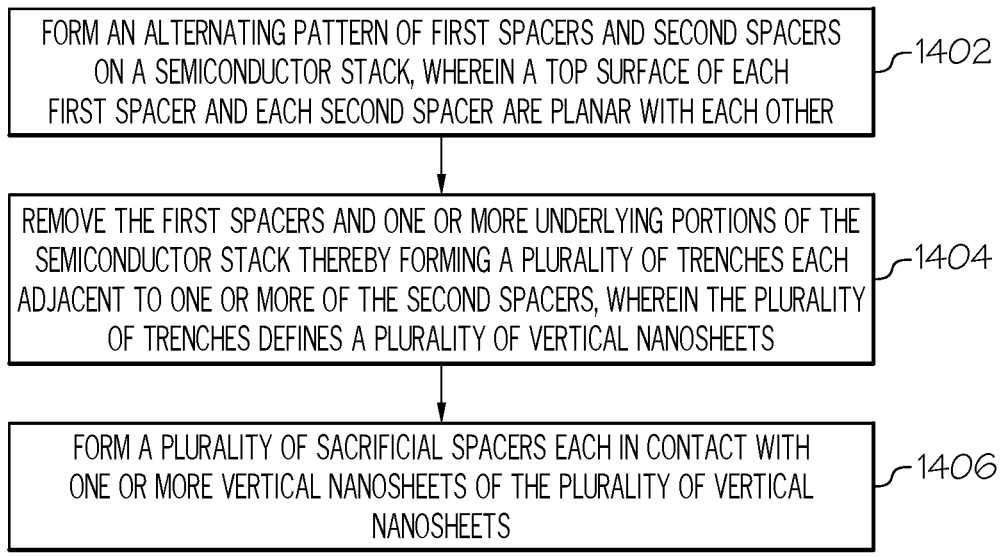
FIG. 14 is an operational flow diagram illustrating one example of a process for forming a nanosheet semiconductor structure according one embodiment of the present invention.

FIG. 14 is an operational flow diagram illustrating one example of a process for forming a nanosheet semiconductor structure according one example of the present invention. It should be noted that each of the steps shown in FIG. 14 has been discussed in greater detail above with respect to FIGS. 1 to 13B. An alternating pattern of first spacers and second spacers are formed on a semiconductor stack at step 1402. A top surface of each first spacer and each second spacer are planar with each other. The first spacers and one or more underlying portions of the semiconductor stack, at step 1404, are removed thereby forming a plurality of trenches each adjacent to one or more of the second spacers. The plurality of trenches defines a plurality of vertically oriented nanosheets. A plurality of sacrificial spacers, at step 1406, is formed each in contact with one or more vertically oriented nanosheets of the plurality of vertically oriented nanosheets.

Figure 15:
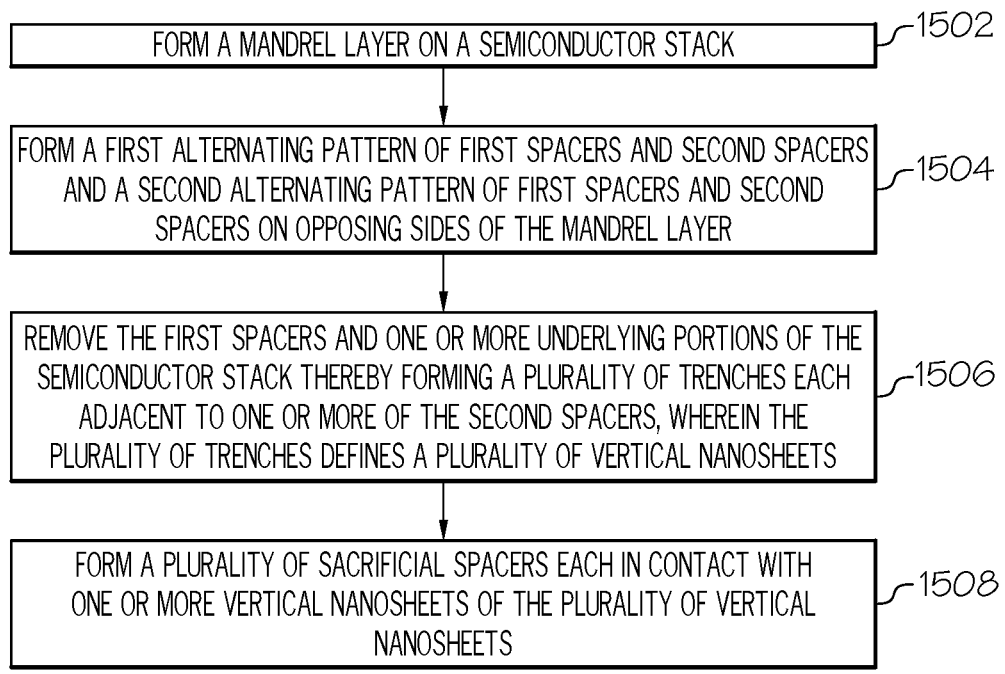
FIG. 15 is an operational flow diagram illustrating another example of a process for forming a nanosheet semiconductor structure according one embodiment of the present invention.

FIG. 15 is an operational flow diagram illustrating another example of a process for forming a nanosheet semiconductor structure according one example of the present invention. It should be noted that each of the steps shown in FIG. 15 has been discussed in greater detail above with respect to FIGS. 1 to 13B. A mandrel layer is formed on a semiconductor stack at step 1502. A first alternating pattern of first spacers and second spacers, and a second alternating pattern of first spacers and second spacers are formed on opposing sides of the mandrel layer at step 1504. The first spacers and one or more underlying portions of the semiconductor stack, at step 1506, are removed thereby forming a plurality of trenches each adjacent to one or more of the second spacers. The plurality of trenches defines a plurality of vertically oriented nanosheets. A plurality of sacrificial spacers is formed each in contact with one or more vertically oriented nanosheets of the plurality of vertically oriented nanosheets at step 1508.

Although specific embodiments of the invention have been taught, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also, these embodiments are only examples of the many advantageous uses of the innovative teachings herein. In general, statements made in the specification of the present application do not necessarily limit any of the various claimed embodiments. Moreover, some statements may apply to some inventive features but not to others.

What is claimed is:

1. A method for forming a nanosheet semiconductor structure, the method comprising:
   forming an alternating pattern of first spacers and second spacers on a semiconductor stack, wherein a top surface of each first spacer and each second spacer are planar with each other;
   removing the first spacers and one or more underlying portions of the semiconductor stack thereby forming a plurality of trenches each adjacent to one or more of the second spacers, wherein the plurality of trenches defines a plurality of vertically oriented nanosheets; and
   forming a plurality of sacrificial spacers each in contact with one or more vertically oriented nanosheets of the plurality of vertically oriented nanosheets.

2. The method of claim 1, wherein removing the one or more underlying portions of the semiconductor stack comprises:
   etching through a channel layer and a second sacrificial layer of the semiconductor stack; and
   etching a portion of a first sacrificial layer of the semiconductor stack.

3. The method of claim 2, wherein forming the plurality of sacrificial spacers comprises:
   epitaxially growing the plurality of sacrificial spacers from remaining portions of the second sacrificial layer.

4. The method of claim 1, further comprising:
   removing the first spacers;
   forming a disposable gate structure over a portion of each vertically oriented nanosheet of the plurality of vertically oriented nanosheets;
   removing a sacrificial layer of the semiconductor stack thereby forming a cavity between a bottom portion of the plurality of sacrificial spacers and a substrate;
   forming a dielectric layer within the cavity; and
   forming a gate spacer in contact with sidewalls of the disposable gate structure.

5. The method of claim 4, wherein forming the gate spacer further comprises:
   forming the gate spacer in contact with a top surface of each vertically oriented nanosheet of the plurality of vertically oriented nanosheets and a top surface of each sacrificial spacer of the plurality of sacrificial spacers.

6. The method of claim 4, wherein forming the dielectric layer further comprises:
   forming the dielectric layer in contact with outer sidewalls of the plurality of sacrificial spacers within a source region and a drain region.

7. The method of claim 4, further comprising:
   removing portions of each vertically oriented nanosheet of the plurality of vertically oriented nanosheets and portions of each sacrificial spacer of the plurality of sacrificial spacers that do not underly the gate spacer thereby forming source/drain recesses;
   removing portions of each sacrificial spacer of the plurality of sacrificial spacers underlying the gate spacer; and
   forming a plurality of inner spacers each in contact with portions of the plurality of sacrificial spacers underlying the disposable gate structure, and further in contact with one or more vertically oriented nanosheets of the plurality of vertically oriented nanosheets underlying the gate spacer.

8. The method of claim 7, further comprising:
   forming source/drain layers within the source/drain recesses;
   removing the disposable gate structure thereby exposing at least a top portion of each vertically oriented nanosheet of the plurality of vertically oriented nanosheets; and
   removing remaining portions of each sacrificial spacer of the plurality of sacrificial thereby exposing sidewalls and a bottom surface of each vertically oriented nanosheet of the plurality of vertically oriented nanosheets.

9. The method of claim 8, further comprising:
forming a gate structure in contact with and surrounding the exposed top portion, bottom surface, and sidewalls of each vertically oriented nanosheet of the plurality of vertically oriented nanosheets.

10. A method for forming a nanosheet semiconductor structure, the method comprising:
forming a mandrel layer on a semiconductor stack;
forming a first alternating pattern of first spacers and second spacers and a second alternating pattern of first spacers and second spacers on opposing sides of the mandrel layer;
removing the first spacers and one or more underlying portions of the semiconductor stack thereby forming a plurality of trenches each adjacent to one or more of the second spacers, wherein the plurality of trenches defines a plurality of vertically oriented nanosheets; and
forming a plurality of sacrificial spacers each in contact with one or more vertically oriented nanosheets of the plurality of vertically oriented nanosheets.

11. The method of claim 10, further comprising:
removing the mandrel layer and etching an underlying portion of the semiconductor stack, the etch defining a first nanosheet stack and a second nanosheet stack each comprising vertically oriented nanosheets from the plurality of vertically oriented nanosheets; and
removing the first spacers.

12. The method of claim 11, further comprising:
forming a disposable gate structure over a portion of the first nanosheet stack and the second nanosheet stack;
removing a first sacrificial layer underlying the first nanosheet stack and a second sacrificial layer underlying the second nanosheet stack thereby forming a first cavity and a second cavity;
forming a dielectric layer within each of the first cavity and the second cavity; and
forming a gate spacer in contact with sidewalls of the disposable gate structure.

13. The method of claim 12, further comprising:
removing portions of each vertically oriented nanosheet of first and second nanosheet stacks and portions of each sacrificial spacer of the plurality of sacrificial spacers that do not underly the gate spacer thereby forming source/drain recesses;
removing portions of each sacrificial spacer of the plurality of sacrificial spacers underlying the gate spacer; and
forming a plurality of inner spacers each in contact with portions of the plurality of sacrificial spacers underlying the disposable gate structure, and further in contact with one or more vertically oriented nanosheets of the first and second nanosheet stacks underlying the gate spacer.

14. The method of claim 13, further comprising:
forming source/drain layers within the source/drain recesses;
removing the disposable gate structure thereby exposing at least a top portion of each vertically oriented nanosheet of the first and second nanosheet stacks; and
removing remaining portions of each sacrificial spacer of the plurality of sacrificial thereby exposing sidewalls and a bottom surface of each vertically oriented nanosheet of the first and second nanosheet stacks.

15. The method of claim 14, further comprising:
forming a gate structure in contact with and surrounding the exposed top surface, bottom surface, and sidewalls of each vertically oriented nanosheet of the first and second nanosheet stacks.

16. A nanosheet semiconductor structure comprising:
a substrate;
a nanosheet stack comprising vertically oriented nanosheets;
a gate structure in contact with and wrapping around the vertically oriented nanosheets;
a source layer and a drain layer each disposed adjacent to the nanosheet stack; and
an inner spacer in contact with the nanosheet stack, wherein the inner spacer isolates the source layer and drain layer from the gate structure.

17. The nanosheet semiconductor structure of claim 16, wherein top surfaces of the vertically oriented nanosheets are planar with each other.

18. The nanosheet semiconductor structure of claim 16, wherein the inner spacer is disposed in contact with a portion of the gate structure, a portion of the source layer, and a portion of the drain layer.

19. The nanosheet semiconductor structure of claim 16, further comprising:
a dielectric layer disposed between the substrate and the inner spacer, and further between the substrate and a bottom portion of the gate structure.

* * * * *